United States Patent
Wu et al.

(10) Patent No.: US 9,594,127 B2
(45) Date of Patent: Mar. 14, 2017

(54) HALL SENSOR DEVICE AND A MANUFACTURE METHOD THEREOF

(71) Applicant: Sensata Technologies Massachusetts, Inc., Attleboro, MA (US)

(72) Inventors: Tianshun Wu, Shanghai (CN); Chengwei Huang, Shanghai (CN); Xiaochi Xu, Shanghai (CN)

(*) Notice: Subject to any disclaimer, the term of this patent is extended or adjusted under 35 U.S.C. 154(b) by 182 days.

(21) Appl. No.: 14/584,247

(22) Filed: Dec. 29, 2014

(65) Prior Publication Data

US 2015/0185295 A1 Jul. 2, 2015

(30) Foreign Application Priority Data

Dec. 31, 2013 (CN) .......................... 2013 1 0749585

(51) Int. Cl.
*G01R 33/00* (2006.01)
*G01R 33/07* (2006.01)
(Continued)

(52) U.S. Cl.
CPC .......... *G01R 33/0052* (2013.01); *G01P 1/026* (2013.01); *G01P 3/488* (2013.01);
(Continued)

(58) Field of Classification Search
CPC ..... G01R 33/0052; G01R 33/07; G01P 3/488; G01P 1/026
(Continued)

(56) References Cited

U.S. PATENT DOCUMENTS 3,323,056 A * 5/1967 Haley .................. G01R 15/185
324/117 R
4,697,758 A * 10/1987 Hirose ................. A01K 89/015
242/223

(Continued)

FOREIGN PATENT DOCUMENTS

DE 102007017730 A1 11/2008
DE 202008016214 U1 4/2010
DE 102011002741 A1 7/2012

OTHER PUBLICATIONS

Allegro MicroSystems, LLC, "Two-Wire Self-Calibrating Differential Speed and Direction Sensor IC with Vibration Immunity", Data Sheet ATS651LSH, 13 pages. Retrieved from the internet on May 13, 2015 from URL:http://www.allegromicro.com/~/media/Files/Datasheets/ATS651-Datasheet.ashx.

(Continued)

*Primary Examiner* — Jermele M Hollington
*Assistant Examiner* — Christopher McAndrew
(74) *Attorney, Agent, or Firm* — Adler Pollock & Sheehan P.C.; George N. Chaclas; Daniel J. Holmander

(57) ABSTRACT

The present invention refers to a Hall sensor device and a manufacturing method thereof. The Hall sensor device includes: two sensor chips each including two pins; a shell, in which four conductive terminals electrically connected with four pins respectively are arranged; three output pins electrically connected to three of the conductive terminals respectively; and a bridge suitable for electrically connecting the rest conductive terminal with the congeneric conductive terminal in the three conductive terminals. The manufacturing method includes: integrally molding the shell and four output pins electrically connected with the four conductive terminals respectively, and cutting off the output pin electrically connected with said rest conductive terminal and providing the bridge. By adopting the present invention, (Continued)

the manufacturing cost of the sensor device is reduced and the production efficiency is improved.

16 Claims, 3 Drawing Sheets

(51) Int. Cl.
  *G01P 1/02* (2006.01)
  *G01P 3/488* (2006.01)
  *G01D 11/24* (2006.01)
(52) U.S. Cl.
  CPC ........... *G01R 33/07* (2013.01); *G01D 11/245* (2013.01); *Y10T 29/49171* (2015.01)
(58) Field of Classification Search
  USPC ....................................................... 324/251
  See application file for complete search history.

(56) References Cited

U.S. PATENT DOCUMENTS

| | | | | |
|---|---|---|---|---|
| 4,857,842 A | * | 8/1989 | Sturman | G01B 7/003 324/207.12 |
| 5,372,435 A | * | 12/1994 | Genero | G01P 3/443 277/317 |
| 6,462,531 B1 | * | 10/2002 | Ohtsuka | H01L 43/065 257/E43.003 |
| 6,498,474 B1 | * | 12/2002 | Turner | G01D 5/145 324/165 |
| 2002/0092090 A1 | * | 7/2002 | Johnson | E03D 5/105 4/302 |
| 2010/0026279 A1 | * | 2/2010 | Vig | G01P 3/488 324/173 |

OTHER PUBLICATIONS

Infineon Technologies AG, "Differential Hall Effect Transmission Speed Sensors", Product Information Guide TLE4954c/51C, dated Oct. 15, 2013, 15 pages. Retrieved from the internet on May 13, 2015 from URL: https://www.infineon.com/dgdl/Infineon-Magnetic_Speed_Sensor_TLE4951C_TLE4954C-PI-v01_00.en.pdf.
Extended European Search Report for corresponding European Patent Application EP14200643.6, "A Hall Sensor Device and Manufacture Method Thereof", date of mailing May 28, 2015.

* cited by examiner

HALL SENSOR DEVICE AND A MANUFACTURE METHOD THEREOF

RELATED APPLICATIONS

This application is related to and claims priority to Chinese Patent Application No. 201310749585.2 filed Dec. 31, 2013, the entire teachings of which are incorporated herein by this reference.

FIELD OF THE INVENTION

The present invention relates to a Hall sensor device and a manufacturing method thereof.

BACKGROUND OF THE INVENTION

It is well known that a magnetic sensor is used for detecting the rotating speed of a target wheel, for example, the magnetic sensor can be a Hall sensor, an anisotropic magnet resistor (AMR) or a giant magnet resistor (GMR), etc. At present, it is known that the Hall sensor can be used for detecting the rotating speed and rotating direction of the target wheel. In general, a single sensor chip is encapsulated in the shell of each sensor device for achieving a certain function, and multiple different sensor devices are used for achieving different functions. However, when multiple functions need to be achieved, the manufacturing cost is high and the structure is not compact when using the multiple sensor devices.

Customers sometimes hope that two sensors are encapsulated in one shell, so as to achieve different functions by using one sensor. Moreover, the application requirements and interface requirements of different customers are also different. For example, a certain customer A needs a Hall sensor provided with three output pins, and it is required that one output pin is a signal end used for outputting a signal including rotating direction information, one pin is a signal end used for outputting a signal including rotating speed information and another pin is a power supply end. A certain customer B needs a Hall sensor provided with three output pins, and it is required that two of the output pins are power supply ends and the other output pin is a signal end used for outputting a signal including information of rotating direction and rotating speed. Since each Hall sensor chip is provided with two pins, namely the signal end and the power supply end, the four pins of the two Hall sensors need to be matched with different three pins requirements of different customers; meanwhile, since the requirements of different customers on pin interfaces are different, usually different moulds need to be adopted and different sensor interfaces need to be designed, if one follows a common design. This will cause high manufacturing cost and low manufacturing efficiency of the sensor device.

SUMMARY OF THE INVENTION

Aiming at the defects and technical demands in the prior art, one purpose of the present invention is to reduce the manufacturing cost and improve the manufacturing efficiency of a sensor device. Another purpose of the present invention is to match the four pins of two Hall sensors with three output pins and obtain the information of rotating speed and rotating direction at the same time. A further purpose of the present invention is to manufacture two types of sensors by using the same mould and match the requirements of different interfaces of two customers and achieve the same function by means of the same encapsulation.

The above-mentioned purposes of the present invention are achieved by such a Hall sensor device that includes: two sensor chips, wherein each chip in the two sensor chips comprises a power supply end pin and a signal end pin; a shell, wherein the two sensor chips are encapsulated in the shell, the four pins of the two sensor chips are electrically connected to four conductive terminals in the shell respectively, the four conductive terminals are divided into two groups, three of the conductive terminals form a first group of conductive terminals, and the rest conductive terminal is a second group of conductive terminal; three output pins, wherein the three output pins are electrically connected to the three conductive terminals in the first group of conductive terminals respectively; and a bridge, wherein the bridge is suitable for electrically connecting the second group of conductive terminal with one conductive terminal in the first group of conductive terminals, wherein the second group of conductive terminal and said one conductive terminal to be electrically connected with the second group of conductive terminal in the first group of conductive terminals are electrically connected with the power supply end pins of the two sensor chips respectively or are electrically connected with the signal end pins of the two sensor chips respectively.

Preferably, the two sensor chips are respectively a directional speed sensor and a non-directional speed sensor.

Preferably, the conductive terminals are respectively a first conductive terminal, a second conductive terminal, a third conductive terminal and a fourth conductive terminal from top to bottom, wherein the first conductive terminal is electrically connected with the signal end pin of the directional speed sensor, the second conductive terminal is electrically connected with the power supply end pin of the non-directional speed sensor, the third conductive terminal is electrically connected with the signal end pin of the non-directional speed sensor, and the fourth conductive terminal is electrically connected with the power supply end pin of the directional speed sensor.

Further preferably, the second group of conductive terminal is the fourth conductive terminal and the bridge is used for electrically connecting the fourth conductive terminal with the second conductive terminal.

Further preferably, the second group of conductive terminal is the first conductive terminal and the bridge electrically connects the first conductive terminal with the third conductive terminal.

Particularly, four windows corresponding to the four conductive terminals are arranged on the shell, the bridge is a clamping element provided with two clamping pins, and the clamping pins are clamped in the windows and are electrically connected with the corresponding conductive terminals.

Particularly, replaceable inserts are arranged on the shell.

Particularly, the sensor device is used for simultaneously detecting the rotating speed and the rotating direction of a target wheel of a vehicle.

Particularly, the signal end pin of the directional speed sensor is used for outputting a pulse signal including rotating direction information, and the signal end pin of the non-directional speed sensor is used for outputting a pulse signal including the information of the amount of the rotating speed while being irrelevant to rotating direction.

Particularly, when a detected object rotates in a positive direction, the signal end pins of the directional speed sensor and the non-directional speed sensor are used for outputting identical pulse signals; when the detected object rotates in a negative direction, the signal end pins of the directional speed sensor and the non-directional speed sensor are used for outputting pulse signals with different frequencies. The present invention further discloses a method for manufacturing the above-mentioned Hall sensor device, including: molding the shell of the Hall sensor device by using a mould, wherein the four conductive terminals are arranged in the shell, the shell is further integrally molded with four output pins, and the four output pins are molded to be electrically connected to the four conductive terminals respectively; electrically connecting the four pins of the two sensor chips with the four conductive terminals respectively, and encapsulating the two sensor chips in the shell; removing connection formed between adjacent output pins in the molding process, and cutting off one of the output pins, wherein the cut off output pin is an output pin electrically connected with the second group of conductive terminal; and providing a bridge, wherein the bridge is suitable for electrically connecting the second group of conductive terminal with one conductive terminal in the first group of conductive terminals, wherein the second group of conductive terminal and said one conductive terminal to be electrically connected with the second group of conductive terminal in the first group of conductive terminals are electrically connected with the power supply end pins of the two sensor chips respectively or are electrically connected with the signal end pins of the two sensor chips respectively.

By means of the above-mentioned technical solutions, the present invention has the following advantages. Two types of sensors meeting the requirements of two customers can be manufactured by using the same mould, the interface requirements of the two customers are matched and the rotating speed and the rotating direction are simultaneously detected by using the same encapsulation structure. Therefore, the manufacturing cost is reduced, the production efficiency is improved, and quality control of the two types of sensors is facilitated.

DETAILED DESCRIPTION OF THE EMBODIMENTS

Figure 1:
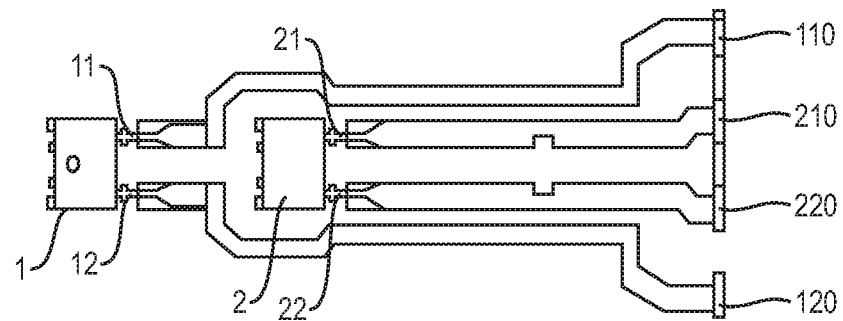
FIG. 1 is a schematic diagram showing an internal connecting structure of a Hall sensor device for a customer A.

The Hall sensor device of the present invention may be a speed sensor used for simultaneously measuring the rotating speed and direction of a target wheel (for example, a wheel on a vehicle). As shown in FIG. 1, the Hall sensor device includes a first Hall sensor chip 1 and a second Hall sensor chip 2.

The first Hall sensor chip 1 may be a directional speed sensor, which is provided with a signal end pin 11 and a power supply end pin 12, wherein the signal end pin 11 is used for outputting a pulse signal including information of rotating direction and the amount of the rotating speed. As a unlimited example, the first Hall sensor chip 1 may be a TLE4954-E1 Hall sensor, and the key parameters thereof are as shown in table 1.

TABLE 1 properties of TLE4954-E1 sensor

| TLE4954-E1 properties | Minimum | Rated | Maximum | Unit |
|---|---|---|---|---|
| Low signal | 6.0 | 7.0 | 8.0 | mA |
| High signal | 12.0 | 14.0 | 16.0 | mA |
| Working frequency (positive direction speed) | | | 12 | kHz |
| Working frequency (negative direction speed) | | | 3 | kHz |

The second Hall sensor chip 2 may be a non-directional speed sensor, which is provided with a power supply end pin 21 and a signal end pin 22, wherein the signal end pin 22 is used for outputting a pulse signal including information of the amount of the rotating speed while being irrelevant to rotating direction. As a unlimited example, the second Hall sensor chip 2 may be a TLE4951 Hall sensor, and the key parameters thereof are as shown in table 2.

TABLE 2 properties of TLE4951 sensor

| TLE4951 properties | Minimum | Rated | Maximum | Unit |
|---|---|---|---|---|
| Low signal | 6.0 | 7.0 | 8.0 | mA |
| High signal | 12.0 | 14.0 | 16.0 | mA |
| Working frequency | | | 12 | kHz |

The first Hall sensor chip 1 and the second Hall sensor chip 2 are encapsulated in the shell 3 of the Hall sensor device, and a first conductive terminal 110, a second conductive terminal 210, a third conductive terminal 220 and a fourth conductive terminal 120 are further arranged in the shell. The signal end pin 11 of the first Hall sensor chip 1 is electrically connected with the first conductive terminal 110, the power supply end pin 21 of the second Hall sensor chip 2 is electrically connected with the second conductive terminal 210, the signal end pin 22 of the second Hall sensor chip 2 is electrically connected with the third conductive terminal 220, and the power supply end pin 12 of the first Hall sensor chip 1 is electrically connected with the fourth conductive terminal 120.

When the first type of Hall sensor device is manufactured, see FIG. 1, the first conductive terminal 110, the second conductive terminal 210 and the third conductive terminal 220 are regarded as the first group of conductive terminals, and the fourth conductive terminal 120 is regarded as the second group of conductive terminal. See FIG. 1 to FIG. 3, the Hall sensor device is provided with output pins 111, 211, 221, the first conductive terminal 110, and the second conductive terminal 210 and the third conductive terminal 220 in the first group of conductive terminals are electrically connected with the output pins 111, 211, 221 of the Hall sensor device respectively. Meanwhile, a bridge 4 is arranged, and the bridge may be used for electrically connecting the second conductive terminal 210 in the first group of conductive terminals with the second group of conductive terminal, namely the fourth conductive terminal 120. As a preferable embodiment, the bridge may be a detachable component.

Figure 2:
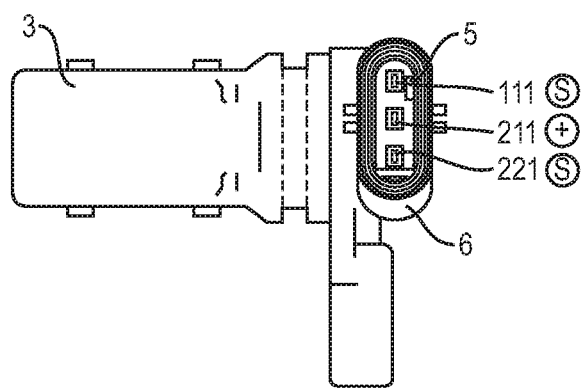
FIG. 2 is a schematic diagram showing an external structure of a Hall sensor device for a customer A.
Figure 3:
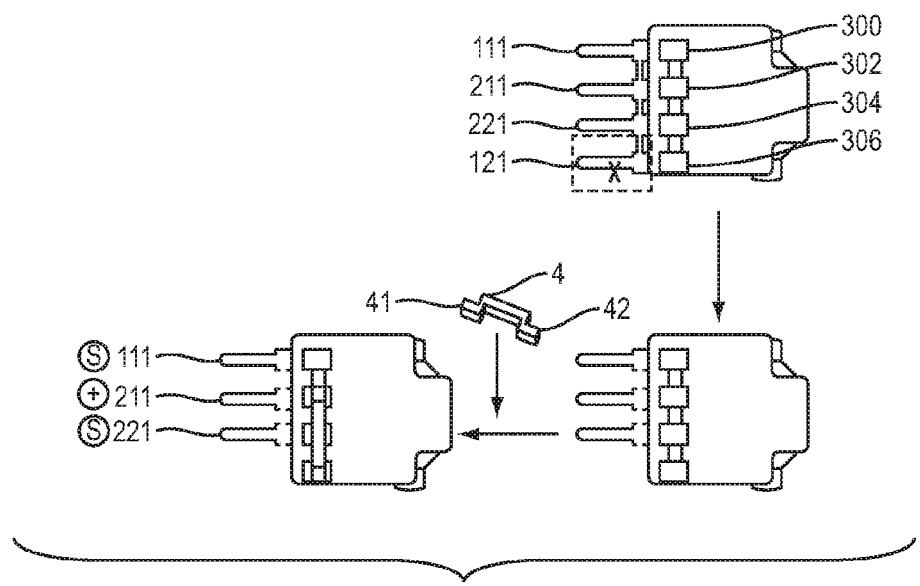
FIG. 3 is a schematic diagram showing a molding method of a Hall sensor device for a customer A.

Further, as shown in FIG. 3, four windows 300, 302, 304, 306 corresponding to the four conductive terminals respectively are arranged on the shell, the bridge 4 is a clamping element provided with two clamping pins 41, 42, and the two clamping pins are respectively inserted and clamped in the windows corresponding to the second conductive terminal 210 and the fourth conductive terminal 120 and are electrically connected with the second conductive terminal 210 and the fourth conductive terminal 120 respectively. The bridge may be made from the same material as the conductive terminals, the pins of the chips and/or the output pins of the Hall sensor device. In this way, the Hall sensor device for a customer A as shown in FIG. 2 is implemented, and the sensor device is provided with three output pins 111, 211, 221, wherein the output pin 111 is used for outputting a signal (namely, the signal output by the signal end pin of the first Hall sensor chip 1) including information of rotating direction and the amount of the rotating speed, the output pin 211 is used for connecting to an input power supply, and the output pin 221 is used for outputting a signal (namely, the signal output by the signal end pin of the second Hall sensor chip 2) including information of the amount of the rotating speed while being irrelevant to rotating direction.

The manufacturing method of the above-mentioned first type of Hall sensor device will be illustrated below in combination with FIG. 3. Firstly, the shell 3 of the Hall sensor device is molded by using a mould, wherein the four conductive terminals 110, 210, 220, 120 are arranged in the shell 3, the shell 3 is further integrally molded with four output pins 111, 211, 221, 121, and the four output pins 111, 211, 221, 121 are molded to be electrically connected to the four conductive terminals 110, 210, 220, 120 respectively. And then, the four pins 11, 21, 12, 22 of the two sensor chips 1, 2 are electrically connected with the four conductive terminals 110, 210, 120, 220 respectively, and the two sensor chips 1, 2 are encapsulated in the shell 3. And then, as shown by "x" in FIG. 3, connection formed between adjacent output pins in the molding process is removed, and the output pin 121 is cut off, and the cut off output pin 121 is an output pin electrically connected with the second group of conductive terminal, namely, the fourth conductive terminal 120. Moreover, the bridge 4 is provided, and the bridge is suitable for electrically connecting the second conductive terminal 210 with the fourth conductive terminal 120.

Figure 4:
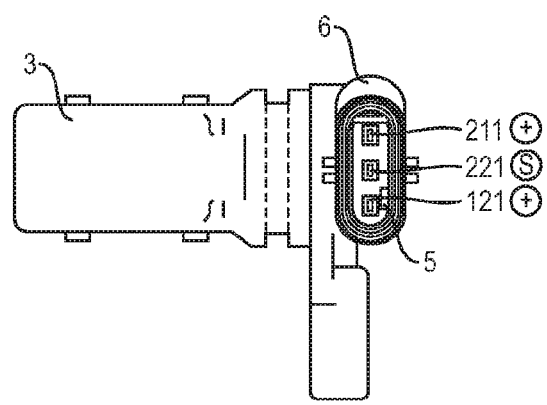
FIG. 4 is a schematic diagram showing an external structure of a Hall sensor device for a customer B.

When the second type of Hall sensor device is manufactured, the second conductive terminal 210, the third conductive terminal 220 and the fourth conductive terminal 120 are regarded as the first group of conductive terminals, and the first conductive terminal 110 is regarded as the second group of conductive terminal. See FIG. 4 to FIG. 5, the Hall sensor device is provided with output pins 211, 221, 121, and the second conductive terminal 210, the third conductive terminal 220 and the fourth conductive terminal 120 in the first group of conductive terminals are electrically connected with the output pins 211, 221, 121 of the Hall sensor device respectively. Similarly, the bridge 4 is arranged, and the bridge may be used for electrically connecting the third conductive terminal 220 in the first group of conductive terminals with the second group of conductive terminal, namely the first conductive terminal 110. Similarly, as a preferable embodiment, the bridge may be a detachable component. Further, the bridge can also be a clamping element provided with two clamping pins, and the clamping pins are inserted in corresponding windows and are electrically connected with corresponding conductive terminals. The bridge may be made from the same material as the conductive terminals, the pins of the chips and/or the output pins of the Hall sensor device. In this way, the Hall sensor device for a customer B as shown in FIG. 4 is implemented, in which the sensor device is provided with three output pins 211, 221, 121, wherein the output pins 211 and 121 are used for being connected to two input power supplies, and the output pin 221 is used for outputting a signal including information of the amount of the rotating speed and the rotating direction, it may be seen from table 1 and table 2 that when the target wheel positively rotates, the pulse signals output by the signal end pins of the first Hall sensor chip 1 and the second Hall sensor chip 2 are completely the same, and at this time, a known sensing system will judge that the target wheel is positively rotating and further judge the amount of the rotating speed thereof accordingly; when the target wheel negatively rotates, the frequencies of the pulse signals output by the signal end pins of the first Hall sensor chip 1 and the second Hall sensor chip 2 are different, and at this time, the known sensing system automatically filters the pulse signal output by the signal end pin of the second Hall sensor chip 2, judges that the target wheel is negatively rotating and judges the amount of the rotating speed thereof accordingly.

Figure 5:
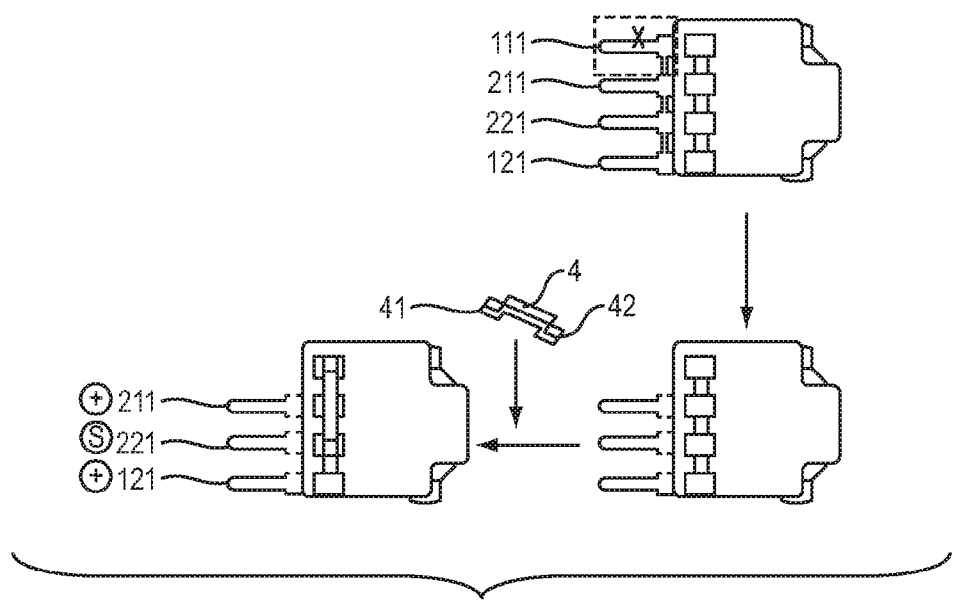
FIG. 5 is a schematic diagram showing a molding method of a Hall sensor device for a customer B.

The manufacturing method of the above-mentioned second type of Hall sensor device will be illustrated below in combination with FIG. 5. The manufacturing method is basically the same with the manufacturing method of the first type of Hall sensor device and may be implemented by the same mould as the first type of Hall sensor device. The only difference lies in that, after the connection formed between adjacent output pins in the molding process is removed as shown by "x" in FIG. 4, the output pin 111 is cut off, and the cut off output pin 111 is an output pin electrically connected with the second group of conductive terminal, namely, the first conductive terminal 110. Moreover, the bridge 4 is provided, and the bridge 4 is suitable for electrically connecting the first conductive terminal 110 with the third conductive terminal 220.

In addition, preferably, in order to meet different application requirements of two types of Hall sensor devices, replaceable inserts 5, 6 may be arranged on the Hall sensor devices. The replaceable inserts can adapt to different installation requirements of different types of Hall sensor devices or adapt to the requirements of the change of the shell structure with the change of the positions of the output pins.

Thus, adopting a universal mould, a universal molding method, the same connecting structure and the universal bridge, and by just changing the cut off output pin and optionally arranging the replaceable inserts, the four pins of the two chips are matched with different types of three output pins needed by two customers, and meanwhile, the same function of measuring the amount of the rotating speed and the rotating direction is achieved. Therefore, a simple structure is utilized in the present invention, to greatly improve the universality of the molding process of the Hall sensors so as to reduce the manufacturing cost and improve the manufacturing efficiency.

The invention claimed is:

1. A Hall sensor device, comprising:
  two sensor chips comprising a total of four pins, wherein each chip in the two sensor chips comprises a power supply end pin and a signal end pin;
  a shell, wherein the two sensor chips are encapsulated in the shell, the four pins of the two sensor chips are electrically connected to four conductive terminals in the shell respectively, the four conductive terminals are divided into two groups, three of the conductive terminals forming a first group of conductive terminals, and the remaining conductive terminal forming a second group of conductive terminal;

three output pins, wherein the three output pins are electrically connected to the three conductive terminals in the first group of conductive terminals respectively; and a bridge comprising a removable clamping element provided with at least two clamping pins, wherein the bridge is suitable for electrically connecting the second group of conductive terminal with one conductive terminal in the first group of conductive terminals, wherein the second group of conductive terminal and said one conductive terminal to be electrically connected with the second group of conductive terminal in the first group of conductive terminals are electrically connected with the power supply end pins of the two sensor chips respectively or are electrically connected with the signal end pins of the two sensor chips respectively.

2. The Hall sensor device of claim 1, wherein the two sensor chips are respectively a directional speed sensor and a non-directional speed sensor.

3. The Hall sensor device of claim 2, wherein the conductive terminals are respectively a first conductive terminal, a second conductive terminal, a third conductive terminal and a fourth conductive terminal from top to bottom, wherein the first conductive terminal is electrically connected with the signal end pin of the directional speed sensor, the second conductive terminal is electrically connected with the power supply end pin of the non-directional speed sensor, the third conductive terminal is electrically connected with the signal end pin of the non-directional speed sensor, and the fourth conductive terminal is electrically connected with the power supply end pin of the directional speed sensor.

4. The Hall sensor device of claim 3, wherein the second group of conductive terminal is the fourth conductive terminal and the bridge is used for electrically connecting the fourth conductive terminal with the second conductive terminal.

5. The Hall sensor device of claim 3, wherein the second group of conductive terminal is the first conductive terminal and the bridge electrically connects the first conductive terminal with the third conductive terminal.

6. The Hall sensor device of claim 1, further comprising four windows corresponding to the four conductive terminals arranged on the shell, wherein the at least two clamping pins are clamped in the windows and are electrically connected with the corresponding conductive terminals.

7. The Hall sensor device of claim 1, further comprising replaceable inserts arranged on the shell.

8. The Hall sensor device of claim 2, further comprising replaceable inserts arranged on the shell.

9. The Hall sensor device of claim 3, further comprising replaceable inserts arranged on the shell.

10. The Hall sensor device of claim 1, wherein the signal end pin of a directional speed sensor is used for outputting a pulse signal including rotating direction information, and the signal end pin of the non-directional speed sensor is used for outputting a pulse signal including the information of the amount of the rotating speed while being irrelevant to rotating direction.

11. The Hall sensor device of claim 2, wherein the signal end pin of the directional speed sensor is used for outputting a pulse signal including rotating direction information, and the signal end pin of the non-directional speed sensor is used for outputting a pulse signal including the information of the amount of the rotating speed while being irrelevant to rotating direction.

12. The Hall sensor device of claim 3, wherein the signal end pin of the directional speed sensor is used for outputting a pulse signal including rotating direction information, and the signal end pin of the non-directional speed sensor is used for outputting a pulse signal including the information of the amount of the rotating speed while being irrelevant to rotating direction.

13. The Hall sensor device of claim 1, wherein, when a detected object rotates in a positive forward direction, the signal end pins of a directional speed sensor and the non-directional speed sensor are used for outputting identical pulse signals, and wherein, when the detected object rotates in a negative reverse direction, the signal end pins of the directional speed sensor and the non-directional speed sensor are used for outputting pulse signals with different frequencies.

14. A method of manufacturing the Hall sensor device of claim 1, the method comprising:

molding the shell of the Hall sensor device by using a mould, wherein the four conductive terminals are arranged in the shell, the shell is further integrally molded with four output pins, and the four output pins are molded to be electrically connected to the four conductive terminals respectively;

electrically connecting the four pins of the two sensor chips with the four conductive terminals respectively, and encapsulating the two sensor chips in the shell;

removing connection formed between adjacent output pins in the molding process, and cutting off one of the output pins, wherein the cut off output pin is an output pin electrically connected with the second group of conductive terminal; and providing a bridge comprising a removable clamping element provided with at least two clamping pins, wherein the bridge is suitable for electrically connecting the second group of conductive terminal with one conductive terminal in the first group of conductive terminals, wherein the second group of conductive terminal and said one conductive terminal to be electrically connected with the second group of conductive terminal in the first group of conductive terminals are electrically connected with the power supply end pins of the two sensor chips respectively or are electrically connected with the signal end pins of the two sensor chips respectively.

15. A Hall sensor device, comprising:

two sensor chips comprising a total of four pins, wherein each chip in the two sensor chips comprises a power supply end pin and a signal end pin;

a shell, wherein the two sensor chips are encapsulated in the shell, the four pins of the two sensor chips are electrically connected to four conductive terminals in the shell respectively, the four conductive terminals are divided into two groups, three of the conductive terminals form a first group of conductive terminals, and the rest conductive terminal is a second group of conductive terminal;

three output pins, wherein the three output pins are electrically connected to the three conductive terminals in the first group of conductive terminals respectively; and a bridge comprising a removable clamping element provided with at least two clamping pins, wherein the bridge is suitable for electrically connecting the second group of conductive terminal with one conductive terminal in the first group of conductive terminals, wherein the second group of conductive terminal and said one conductive terminal to be electrically connected with the second group of conductive terminal in the first group of conductive terminals are electrically connected with the power supply end pins of the two sensor chips respectively or are electrically connected with the signal end pins of the two sensor chips respectively, wherein the two sensor chips are respectively a directional speed sensor and a non-directional speed sensor, wherein the conductive terminals are respectively a first conductive terminal, a second conductive terminal, a third conductive terminal and a fourth conductive terminal from top to bottom, wherein the first conductive terminal is electrically connected with the signal end pin of the directional speed sensor, the second conductive terminal is electrically connected with the power supply end pin of the non-directional speed sensor, the third conductive terminal is electrically connected with the signal end pin of the non-directional speed sensor, and the fourth conductive terminal is electrically connected with the power supply end pin of the directional speed sensor, wherein the second group of conductive terminal is the fourth conductive terminal and the bridge is used for electrically connecting the fourth conductive terminal with the second conductive terminal, wherein the Hall sensor device further comprises four windows corresponding to the four conductive terminals arranged on the shell, wherein the bridge is a clamping element provided with two clamping pins, and wherein the clamping pins are clamped in the windows and are electrically connected with the corresponding conductive terminals.

16. A Hall sensor device, comprising:

two sensor chips comprising a total of four pins, wherein each chip in the two sensor chips comprises a power supply end pin and a signal end pin;

a shell, wherein the two sensor chips are encapsulated in the shell, the four pins of the two sensor chips are electrically connected to four conductive terminals in the shell respectively, the four conductive terminals are divided into two groups, three of the conductive terminals form a first group of conductive terminals, and the rest conductive terminal is a second group of conductive terminal;

three output pins, wherein the three output pins are electrically connected to the three conductive terminals in the first group of conductive terminals respectively; and a bridge comprising a removable clamping element provided with at least two clamping pins, wherein the bridge is suitable for electrically connecting the second group of conductive terminal with one conductive terminal in the first group of conductive terminals, wherein the second group of conductive terminal and said one conductive terminal to be electrically connected with the second group of conductive terminal in the first group of conductive terminals are electrically connected with the power supply end pins of the two sensor chips respectively or are electrically connected with the signal end pins of the two sensor chips respectively, wherein the two sensor chips are respectively a directional speed sensor and a non-directional speed sensor, wherein the conductive terminals are respectively a first conductive terminal, a second conductive terminal, a third conductive terminal and a fourth conductive terminal from top to bottom, wherein the first conductive terminal is electrically connected with the signal end pin of the directional speed sensor, the second conductive terminal is electrically connected with the power supply end pin of the non-directional speed sensor, the third conductive terminal is electrically connected with the signal end pin of the non-directional speed sensor, and the fourth conductive terminal is electrically connected with the power supply end pin of the directional speed sensor, wherein the second group of conductive terminal is the fourth conductive terminal and the bridge is used for electrically connecting the fourth conductive terminal with the second conductive terminal, and wherein the Hall sensor device further comprises replaceable inserts arranged on the shell.

* * * * *